United States Patent
Ueda et al.

(10) Patent No.: US 11,532,467 B2
(45) Date of Patent: Dec. 20, 2022

(54) MAINTENANCE DEVICE

(71) Applicant: Tokyo Electron Limited, Tokyo (JP)

(72) Inventors: Takehiro Ueda, Miyagi (JP); Jun Hirose, Miyagi (JP); Kazuyuki Tezuka, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 155 days.

(21) Appl. No.: 17/009,908

(22) Filed: Sep. 2, 2020

(65) Prior Publication Data

US 2020/0402764 A1 Dec. 24, 2020

Related U.S. Application Data

(63) Continuation of application No. PCT/JP2019/023190, filed on Jun. 12, 2019.

(30) Foreign Application Priority Data

Jun. 25, 2018 (JP) .............................. JP2018-119448

(51) Int. Cl.
*H01J 37/32* (2006.01)
*H01L 21/67* (2006.01)

(52) U.S. Cl.
CPC .... *H01J 37/3288* (2013.01); *H01L 21/67069* (2013.01)

(58) Field of Classification Search
CPC .......... H01L 21/67069; H01L 21/3065; H01L 21/68721; H01L 21/6719; H01J 37/3288
See application file for complete search history.

(56) References Cited

U.S. PATENT DOCUMENTS

| | | | | |
|---|---|---|---|---|
| 6,045,618 A | * | 4/2000 | Raoux | B01D 45/06 55/284 |
| 2001/0032591 A1 | * | 10/2001 | Carducci | H01J 37/32834 118/723 E |
| 2007/0130733 A1 | * | 6/2007 | Kasai | B29C 66/1248 24/585.12 |
| 2013/0263895 A1 | * | 10/2013 | Lee | C23C 16/4407 134/166 R |

FOREIGN PATENT DOCUMENTS

| | | | | |
|---|---|---|---|---|
| JP | 61002250 A | * | 1/1986 | ............. H01J 37/18 |
| JP | 2000-269183 A | | 9/2000 | |
| JP | 2006-196691 A | | 7/2006 | |

OTHER PUBLICATIONS

International Search Report and Written Opinion dated Jul. 30, 2019 for PCT/JP2019/023190 filed on Jun. 12, 2019, 9 pages including English Translation of the International Search Report.

\* cited by examiner

*Primary Examiner* — Yuechuan Yu
(74) *Attorney, Agent, or Firm* — Xsensus LLP

(57) ABSTRACT

A maintenance device has a cover and a fixing member. The cover is in a vacuum atmosphere during substrate processing, is formed to have a size corresponding to a boundary line between a first part and a second part of a processing container, which can be separated into the first part and the second part, or an opening surface separating the first part and the second part, and has airtightness, and visual transparency at least in a part. The fixing member fixes in an airtight manner the cover along the boundary line between the first part and the second part of the processing container or to the opening surface separating the first part and the second part.

8 Claims, 17 Drawing Sheets

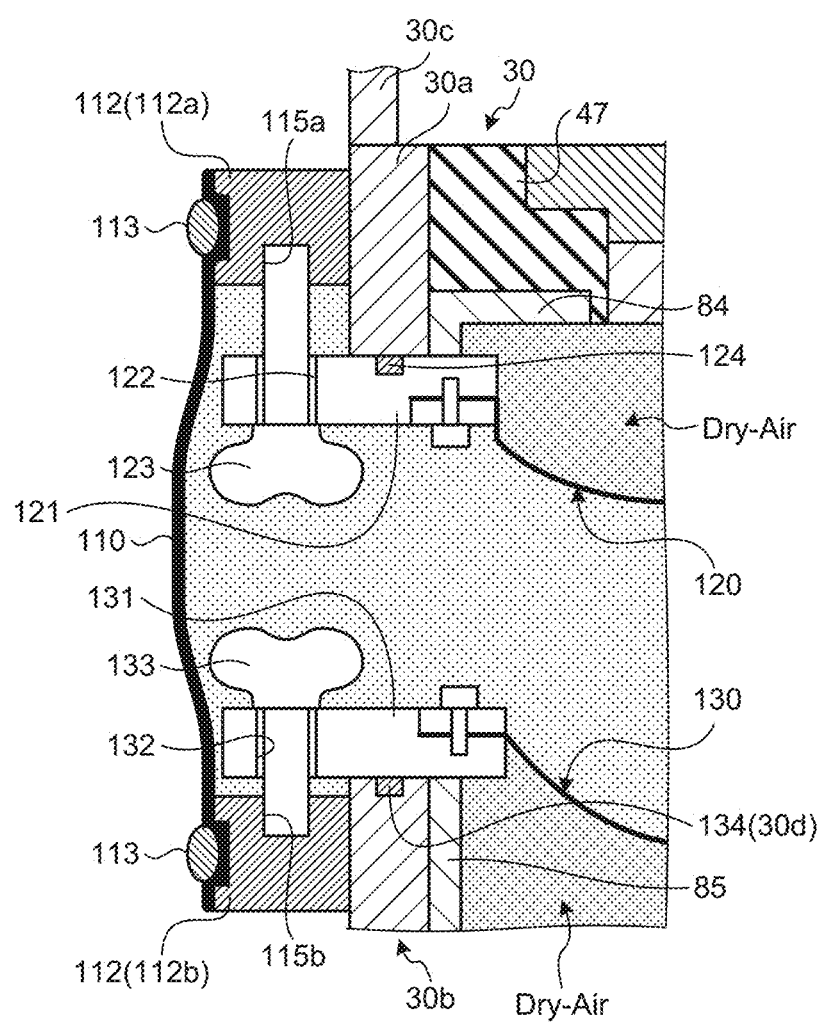

MAINTENANCE DEVICE

CROSS-REFERENCE TO RELATED APPLICATIONS

This application is a bypass continuation of PCT filing PCT/JP2019/023190, filed Jun. 12, 2019, which claims priority to JP 2018-119448, filed Jun. 25, 2018, the entire contents of each are incorporated herein by reference.

FIELD

The present disclosure relates to a maintenance device.

BACKGROUND

In a plasma etching apparatus, a focus ring installed on the outer periphery of a semiconductor wafer (hereinafter, referred to as a "wafer") is consumed by an etching process. Therefore, Patent Literature 1 discloses a technique of replacing the focus ring via a transfer system for transferring the wafer to the plasma etching apparatus.

Patent Literature 1: Japanese Laid-open Patent Publication No. 2006-196691

The present disclosure provides a technique capable of easily performing maintenance without exposing the inside of a processing container to the outside air.

SUMMARY

In an embodiment of a present disclosure, a maintenance device includes a cover that is in a vacuum atmosphere during substrate processing, is formed to have a size corresponding to a boundary line between a first part and a second part of a processing container, which is separable into the first part and the second part, or an opening surface separating the first part and the second part, and has airtightness, and visual transparency at least in a part; and a fixing member that fixes in an airtight manner the cover along the boundary line between the first part and the second part of the processing container or to the opening surface separating the first part and the second part.

BRIEF DESCRIPTION OF DRAWINGS

FIG. 11B is a diagram illustrating an example of a state where the second maintenance device according to the embodiment is attached to the upper part.

DESCRIPTION OF EMBODIMENT

Hereinafter, an embodiment of a maintenance device disclosed in the present application will be described in detail with reference to the drawings. The disclosed maintenance device is not limited to the embodiment.

By the way, a focus ring has a larger diameter and is heavier than a wafer. Therefore, in a case where replacement of the focus ring is performed by using a transfer system that transfers the wafer, a sturdy transfer unit that can transfer the focus ring is required. Moreover, a width which enables the pass of the focus ring is required. Further, in a plasma etching apparatus, in addition to the focus ring, there are parts that require regular maintenance, such as a chamber protection part located on the outer periphery of the focus ring and an upper electrode that is a counter electrode. In order to enable replacement of such a part, a transfer system with a higher degree of difficulty is required, which is an extremely expensive system.

Therefore, the plasma etching apparatus generally performs replacement of a part of the processing container by exposing the processing container to the atmospheric air. However, in a case where the inside of the processing container is exposed to the atmospheric air by the atmosphere exposure, the plasma etching apparatus requires a considerable amount of time to restart the process because of the temperature adjustment and the moisture control, which causes a problem of productivity. In particular, when moisture contained in the atmospheric air adheres to the part inside the processing container, the moisture is not easily degassed during evacuation, which requires a considerable time for evacuation. Further, in a case where fluoride adheres to the inside of the processing container, the fluoride reacts with moisture in the atmospheric air to become hydrogen fluoride (HF), which may cause the deterioration of the part in the processing container.

Therefore, it is expected that the maintenance can be easily performed without exposing the inside of the processing container to the outside air.

Configuration of Maintenance Target Device

A maintenance target device which is a target for maintenance by the maintenance device will be described.

The maintenance target device is a device having a processing container in a vacuum atmosphere. In this embodiment, a case where the maintenance target device is a plasma etching apparatus will be described as an example. Note that the maintenance target device is not limited to the plasma etching apparatus.

Figure 1:
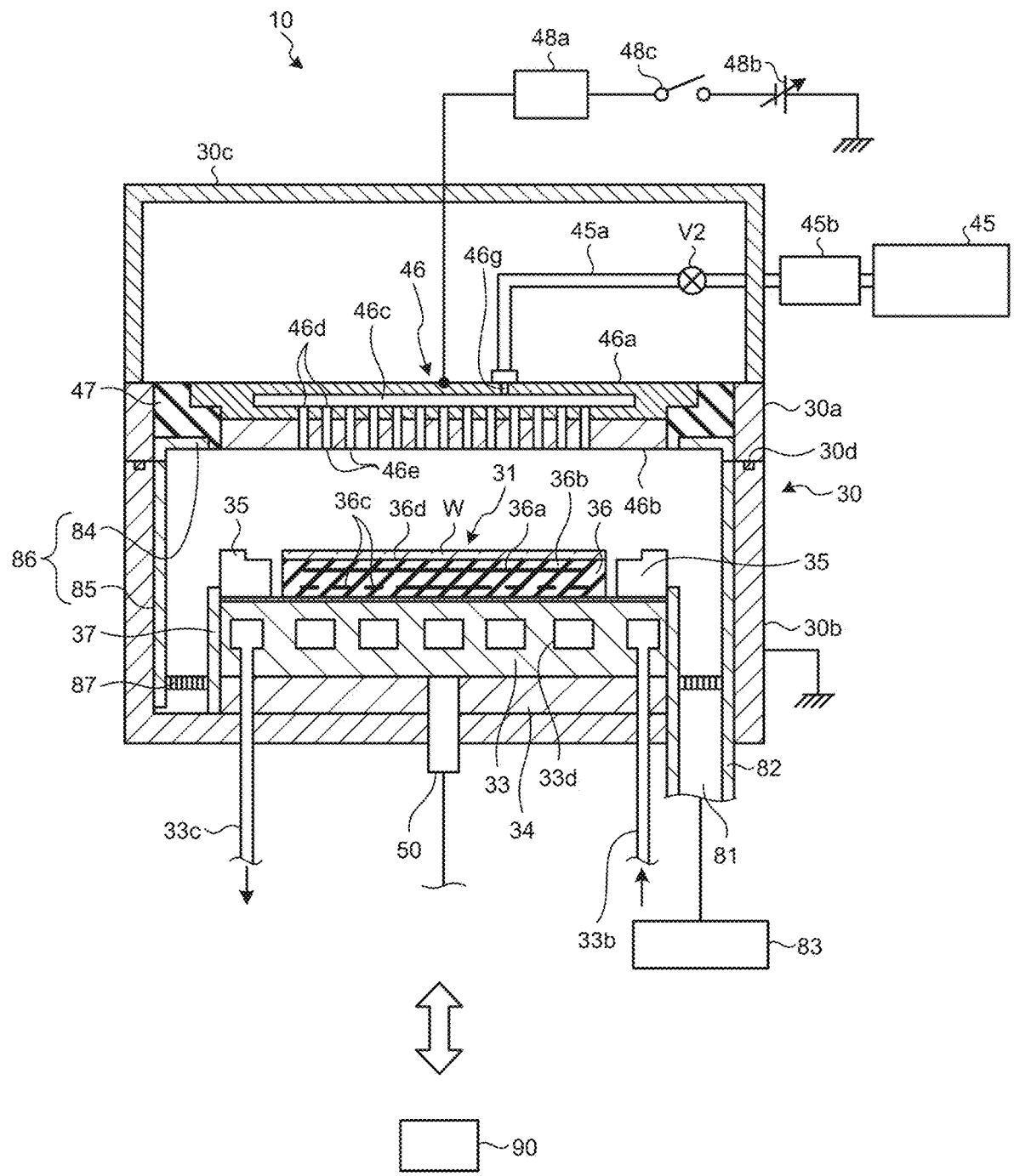
FIG. 1 is a diagram schematically illustrating a plasma etching apparatus according to an embodiment.

FIG. 1 is a diagram schematically illustrating the plasma etching apparatus according to an embodiment. A plasma etching apparatus 10 includes a processing container 30 that is configured to be airtight and is electrically set to the ground potential. The processing container 30 has a cylindrical shape and is made of, for example, aluminum with an anodized film formed on the surface thereof. The processing container 30 forms a processing space in which plasma is generated. A placing pedestal 31 that horizontally supports a wafer W is housed in the processing container 30.

The placing pedestal 31 has a substantially columnar shape with bottom surfaces facing in an up-down direction, and the upper bottom surface is a placing surface 36d. The placing surface 36d of the placing pedestal 31 has a size larger than that of the wafer W. The placing pedestal 31 includes a base 33 and an electrostatic chuck 36.

The base 33 is made of conductive metal such as aluminum. The base 33 functions as a lower electrode. The base 33 is supported by a support 34 as an insulator, and the support 34 is installed at a bottom portion of the processing container 30.

The electrostatic chuck 36 has a disk-shaped flat upper surface, and the upper surface is the placing surface 36d on which the wafer W is placed. The electrostatic chuck 36 is provided at the center of the placing pedestal 31 in plan view. The electrostatic chuck 36 has an electrode 36a and an insulator 36b. The electrode 36a is provided inside the insulator 36b, and a DC power supply (not illustrated) is connected to the electrode 36a. The electrostatic chuck 36 is configured to attract the wafer W by the Coulomb force when a DC voltage is applied to the electrode 36a from a DC power supply. Further, in the electrostatic chuck 36, a heater 36c is provided inside the insulator 36b. The heater 36c is supplied with power via a power supply mechanism described later, and controls the temperature of the wafer W.

A focus ring 35 made of, for example, single crystal silicon is provided on the outer periphery of the upper portion of the placing pedestal 31. Further, a cylindrical inner wall member 37 made of, for example, quartz is provided so as to surround the placing pedestal 31 and the support 34.

A power supply rod 50 is connected to the base 33. The base 33 is configured to be supplied with high-frequency power of a predetermined frequency for plasma generation from a high-frequency power source (not illustrated) via the power supply rod 50.

A coolant channel 33d is formed inside the base 33. The coolant channel 33d has one end connected to a coolant inlet pipe 33b and the other end connected to a coolant outlet pipe 33c. The plasma etching apparatus 10 is configured to be able to control the temperature of the placing pedestal 31 by circulating a coolant such as cooling water, in the coolant channel 33d. The plasma etching apparatus 10 may be configured to be able to individually control the temperatures of the wafer W and the focus ring 35 by separately providing the coolant channels in the base 33 to correspond to the regions where the wafer W and the focus ring 35 are placed. Further, the plasma etching apparatus 10 may be configured to be able to individually control the temperatures by supplying the cold heat transfer gas to the back surface sides of the wafer W and the focus ring 35. For example, a gas supply pipe for supplying the cold heat transfer gas (backside gas) such as helium gas to the back surface of the wafer W may be provided to penetrate the placing pedestal 31 and the like. The gas supply pipe is connected to a gas supply source. With these configuration, the wafer W attracted and held on the upper surface of the placing pedestal 31 by the electrostatic chuck 36 is controlled to a predetermined temperature.

On the other hand, a shower head 46 having a function as an upper electrode is provided above the placing pedestal 31 so as to face the placing pedestal 31 in parallel. The shower head 46 and the placing pedestal 31 function as a pair of electrodes (an upper electrode and a lower electrode).

The shower head 46 is provided on the top wall portion of the processing container 30. The shower head 46 includes a main body portion 46a and an upper top plate 46b serving as an electrode plate, and is supported to the upper portion of the processing container 30 via an insulating member 47. The main body portion 46a is made of a conductive material, for example, aluminum with an anodized film formed on the surface thereof, and is configured to be able to support the upper top plate 46b on the lower portion thereof in an attachable and detachable manner.

A gas diffusion chamber 46c is provided inside the main body portion 46a, and a large number of gas flow holes 46d are formed at a bottom portion of the main body portion 46a so as to be located below the gas diffusion chamber 46c. Further, gas introduction holes 46e are provided in the upper top plate 46b to penetrate the upper top plate 46b in a thickness direction so as to overlap the above-described gas flow holes 46d. With such a configuration, the processing gas supplied to the gas diffusion chamber 46c is supplied by being dispersed like a shower into the processing container 30 through the gas flow holes 46d and the gas introduction holes 46e.

A gas introduction port 46g for introducing the processing gas into the gas diffusion chamber 46c is formed in the main body portion 46a. One end of a gas supply pipe 45a is connected to the gas introduction port 46g. A gas supply source 45 that supplies various kinds of gas including the processing gas is connected to the other end of the gas supply pipe 45*a*. The gas supply pipe 45*a* is provided with a mass flow controller (MFC) 45*b* and an opening/closing valve V2 in order from the upstream side. Then, the processing gas for plasma etching from the gas supply source 45 is supplied to the gas diffusion chamber 46*c* through the gas supply pipe 45*a*, and is supplied by being dispersed like a shower into the processing container 30 through the gas flow holes 46*d* and the gas introduction holes 46*e* from the gas diffusion chamber 46*c*.

A variable DC power supply 48*b* is electrically connected to the shower head 46 as the upper electrode via a low pass filter (LPF) 48*a*. The variable DC power supply 48*b* is configured such that power supply can be turned on/off by an on/off switch 48*c*. The current/voltage of the variable DC power supply 48*b* and the on/off of the on/off switch 48*c* are controlled by a controller 90 described later.

Further, a cylindrical ground conductor 30*c* is provided to extend from the side wall of the processing container 30 to a position higher than the height position of the shower head 46. The cylindrical ground conductor 30*c* has a top wall at the upper portion.

An exhaust port 81 is formed at a bottom portion of the processing container 30. An exhaust device 83 is connected to the exhaust port 81 via an exhaust pipe 82. The exhaust device 83 has a vacuum pump, and is configured so that the inside of the processing container 30 can be depressurized to a predetermined degree of vacuum by the actuation of the vacuum pump.

A deposition shield 86 is provided on the inner side of the side portion of the processing container 30 along an inner wall surface. The deposition shield 86 prevents the etching by-product (deposition) from adhering to the processing container 30. The deposition shield 86 is configured to be attachable and detachable. An exhaust plate 87 is provided between the deposition shield 86 and the cylindrical inner wall member 37. The exhaust plate 87 is formed with a plurality of through-holes, and allows communication between the inner space of the processing container 30 and the exhaust port 81.

The operation of the plasma etching apparatus 10 having the above configuration is comprehensively controlled by the controller 90. The controller 90 is, for example, a computer, and controls each unit of the plasma etching apparatus 10. The operation of the plasma etching apparatus 10 is comprehensively controlled by the controller 90.

By the way, in the plasma etching apparatus 10, in order to enable replacement of a part inside the processing container 30, the processing container 30 forming a processing space is configured by joining a first part and a second part to each other, and can be separated into the first part and the second part. In the embodiment, the processing container 30 is configured by joining an upper part 30*a* on the upper side and a lower part 30*b* on the lower side, and can be separated into the upper part 30*a* and the lower part 30*b*. For example, the processing container 30 can be separated into the upper part 30*a* and the lower part 30*b* near the lower portion of the insulating member 47. The shower head 46 that functions as the upper electrode is included in the upper part 30*a*. The placing pedestal 31 that functions as the lower electrode is included in the lower part 30*b*. In the processing container 30, a seal member 30*d* such as an O-ring is provided on a joining surface between the upper part 30*a* and the lower part 30*b*, and the airtightness can be maintained in the joined state. Further, in the embodiment, the deposition shield 86 can be separated into an upper deposition shield 84 and a lower deposition shield 85, and can be separated near the lower portion of the insulating member 47, similar to the upper part 30*a* and the lower part 30*b*. In this case, the upper deposition shield 84 is also included in the upper part 30*a*. Note that, depending on the designed structure around the deposition shield 86 and the insulating member 47, the deposition shield 86 may not necessarily be divided, and the insulating member 47 may be divided.

Figure 2:
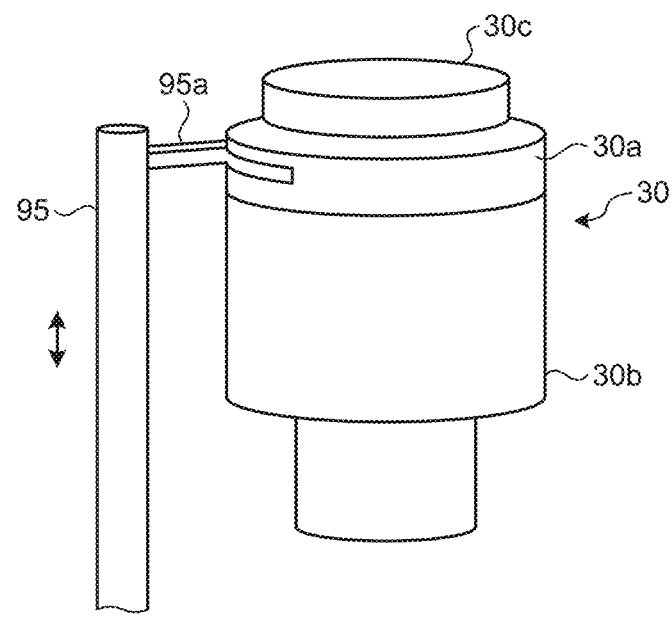
FIG. 2 is a diagram illustrating an example of an outer appearance of a processing container according to the embodiment.

FIG. 2 is a diagram illustrating an example of an outer appearance of the processing container according to the embodiment. FIG. 2 schematically illustrates the outer appearance of the processing container 30. The processing container 30 has a cylindrical shape, and is configured by joining the upper part 30*a* and the lower part 30*b*. A lifting mechanism 95 is provided beside the processing container 30. The lifting mechanism 95 is provided with an arm 95*a* that supports the upper part 30*a*, and the upper part 30*a* can be lifted up and down via the arm 95*a* by lifting up and down the lifting mechanism 95. Further, the lifting mechanism 95 is capable of rotating the arm 95*a* with the lifting mechanism 95 as an axis in a raised state, and the raised upper part 30*a* can be slid in the rotation direction.

By the way, in the plasma etching apparatus 10, a part consumed by the etching process using plasma may be present in the processing container 30 and replacement of the part may be needed. For example, in the plasma etching apparatus 10, the focus ring 35 installed on the outer periphery of the wafer W is consumed by the etching process. In a case where replacement of a part such as the focus ring 35 is performed by opening the processing container 30 to the atmospheric air, the temperature adjustment and the moisture control in the processing container 30 are necessary, and thus the plasma etching apparatus 10 requires a considerable amount of time to restart the etching process on the wafer W. As a result, the productivity of the plasma etching apparatus 10 is reduced.

Therefore, the operator performs replacement of the part by using the maintenance device according to the embodiment, which will be described below.

Configuration of Maintenance Device

Figure 3:
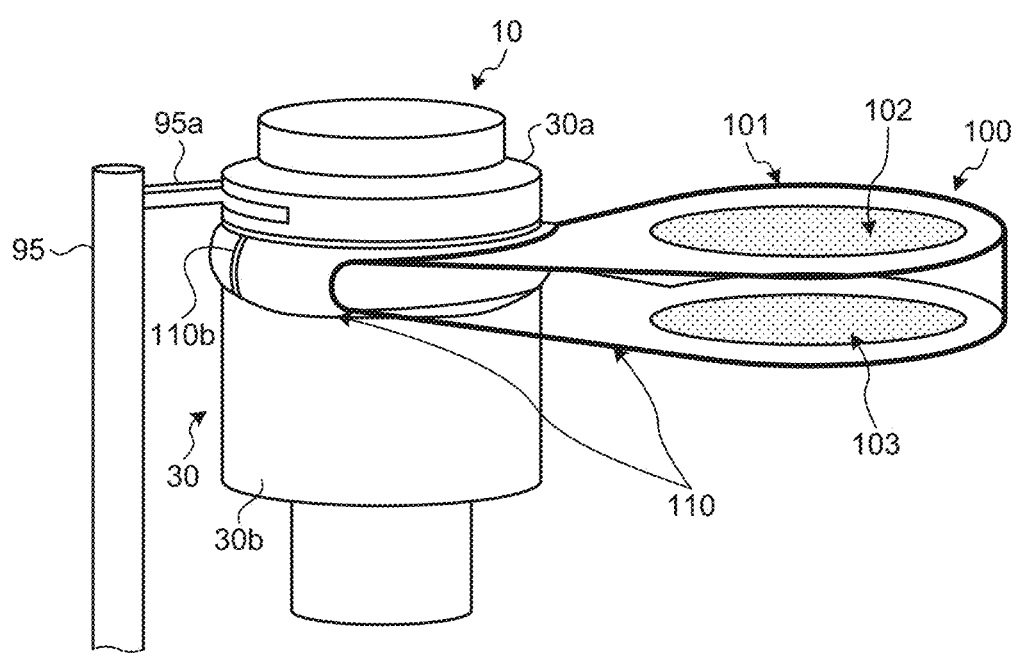
FIG. 3 is a diagram illustrating an example of a maintenance device according to the embodiment.

Next, a configuration of a maintenance device according to the embodiment will be described. FIG. 3 is a diagram illustrating an example of the maintenance device according to the embodiment. FIG. 3 illustrates a state before the processing container 30 is opened. A maintenance device 100 according to the embodiment includes a first maintenance device 101, a second maintenance device 102, and a third maintenance device 103.

The first maintenance device 101 has a cover 110. The cover 110 is a bag body in which an opening having a size corresponding to the boundary line between the upper part 30*a* and the lower part 30*b* is formed. The cover 110 has airtightness, and visual transparency at least in a part. For example, the cover 110 is made of a transparent synthetic resin such as polyvinyl chloride, and the entire cover 110 has visual transparency. The second maintenance device 102 and the third maintenance device 103 are disposed inside the cover 110. The details of the second maintenance device 102 and the third maintenance device 103 will be described later.

Figure 4:
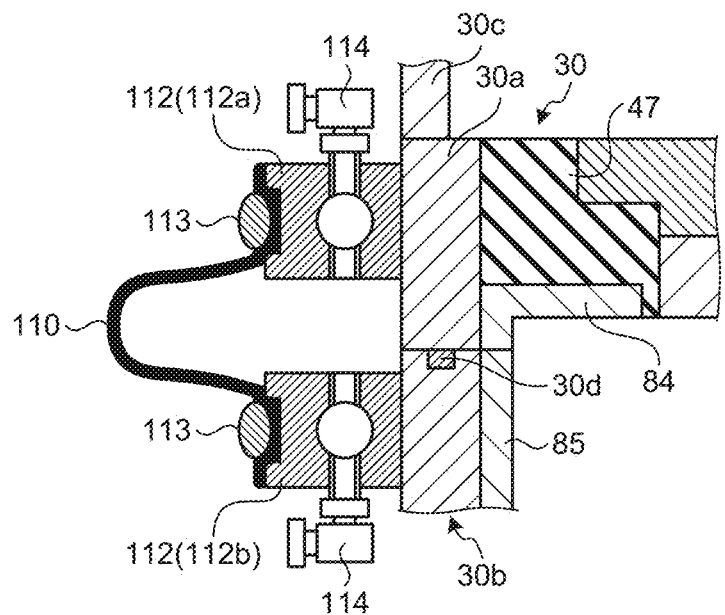
FIG. 4 is a diagram illustrating a state in which an adapter according to the embodiment is disposed in the processing container.

FIG. 4 is a diagram illustrating a state in which the first maintenance device according to the embodiment is disposed in the processing container. The first maintenance device 101 has a fixing member for fixing the cover 110 to the processing container 30. In the embodiment, the first maintenance device 101 has an adapter 112 and a clamp ring 113 as the fixing member.

Two adapters 112 are disposed above and below the boundary line between the upper part 30a and the lower part 30b. For example, the adapter 112 is configured by being divided into a plurality of parts, and the parts are respectively and vertically disposed along the boundary line by being sequentially disposed above and below the boundary line between the upper part 30a and the lower part 30b.

On the outer peripheral surface of the processing container 30, an adapter 112a is disposed above the boundary line between the upper part 30a and the lower part 30b, and an adapter 112b is disposed below the boundary line between the upper part 30a and the lower part 30b. A joint 114 penetrating in the up-down direction is provided to a part of the adapter 112. The adapter 112 may be fixed to the processing container 30 in advance without being attachable and detachable. For example, the processing container 30 may be integrally formed with the adapter 112. Further, instead of the joint 114, a valve capable of changing the open state and the closed state may be provided to the adapter 112.

Figure 5:
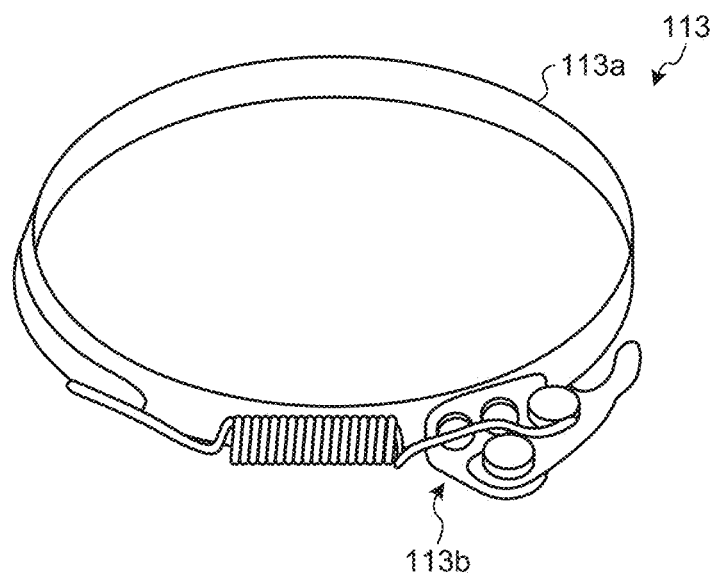
FIG. 5 is a diagram illustrating an example of a clamp ring according to the embodiment.

FIG. 5 is a diagram illustrating an example of the clamp ring according to the embodiment. The clamp ring 113 has a long belt portion 113a and a fixing portion 113b. One end of the belt portion 113a is fixed to the fixing portion 113b, and the other end of the belt portion 113a is attachable and detachable to and from the fixing portion 113b. Further, the fixing portion 113b is capable of adjusting a fixing position for fixing the other end of the mounted belt portion 113a. The clamp ring 113 can adjust the tightening by the belt portion 113a by changing the fixing position of the other end of the belt portion 113a by the fixing portion 113b.

Return to FIG. 3. The opening of the cover 110 is provided with a zipper portion 110b which can be joined facing each other while maintaining airtightness. The operator covers the boundary line between the upper part 30a and the lower part 30b from one side with the opening of the cover 110, and joins the zipper portion 110b on the other side. Then, the operator installs the clamp ring 113 along the adapter 112 from above the cover 110.

Figure 6:
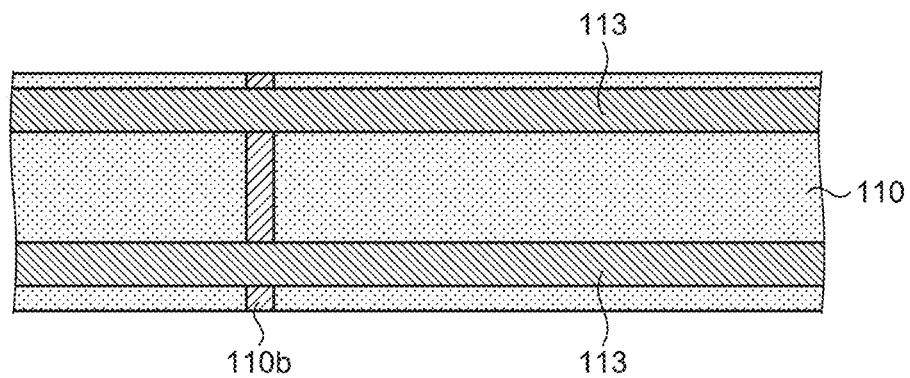
FIG. 6 is a diagram illustrating an example of a state in which the clamp ring is installed on a cover.

FIG. 6 is a diagram illustrating an example of a state in which the clamp ring is installed on the cover. The cover 110 is fastened, on the upper side and the lower side thereof, by two clamp rings 113 including the joined zipper portion 110b. Since the zipper portion 110b is joined, the outside atmospheric air does not pass through the zipper portion 110b, and the cover 110 maintains the airtightness. As a result, on the outer peripheral surface of the processing container 30, the inside covered with the cover 110 is shielded from the outside.

Figure 7A:
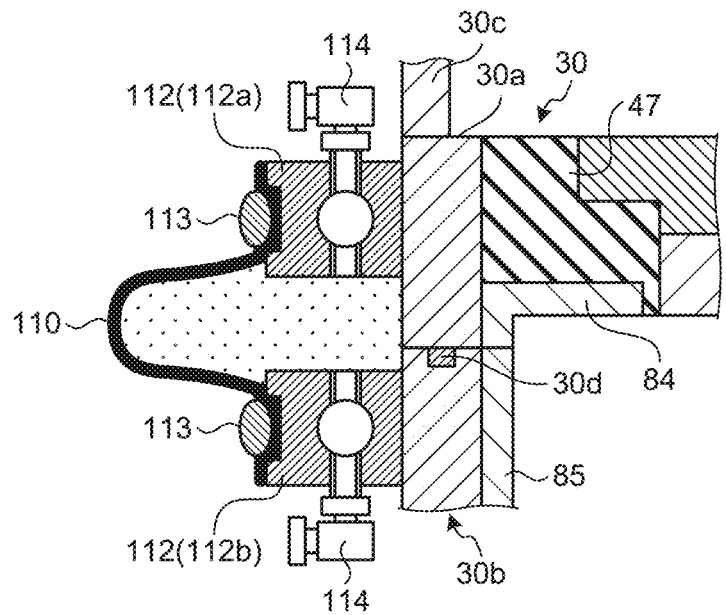
FIG. 7A is a diagram illustrating an example of a state of the atmospheric air in an inside covered with the cover.
Figure 7B:
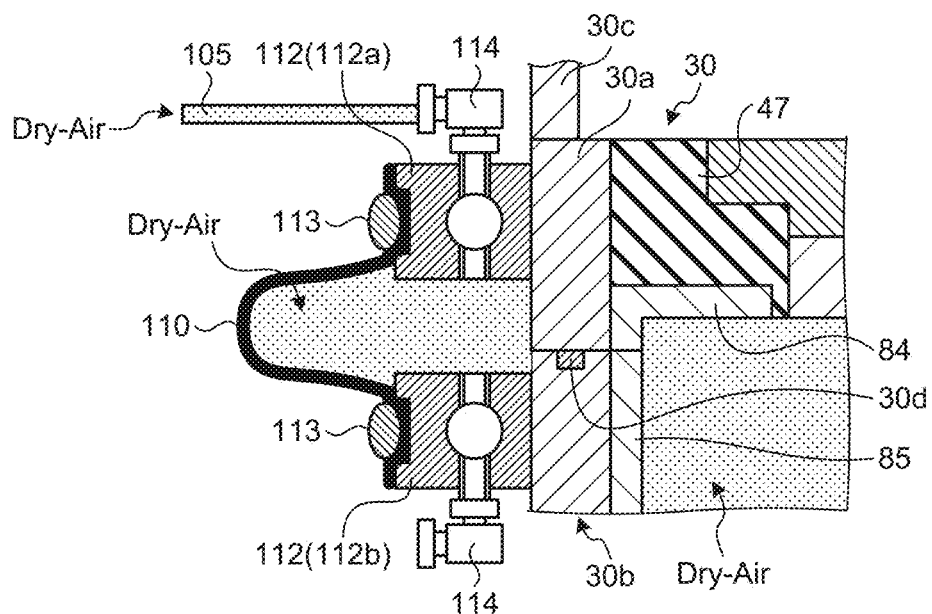
FIG. 7B is a diagram illustrating an example of a state of the atmospheric air in the inside covered with the cover.

FIGS. 7A and 7B are diagrams illustrating an example of a state of the atmospheric air in the inside covered with the cover. As illustrated in FIG. 7A, the inside covered with the cover 110 is filled with the outside atmospheric air containing moisture. The operator fills the inside of the processing container 30 and the inside covered with the cover 110 with dry air. For example, the operator operates the plasma etching apparatus 10 to supply the dry air from the gas supply source 45 and introduce the dry air from the shower head 46 into the processing container 30, so as to fill the inside of the processing container 30 with the dry air. Further, the operator connects a gas pipe 105 for supplying dry air, to any joint 114 of the adapter 112 and opens the other joint 114. As a result, as illustrated in FIG. 7B, the atmospheric air in the inside covered with cover 110, on the outer peripheral surface of the processing container 30 is replaced with dry air.

Figure 7C:
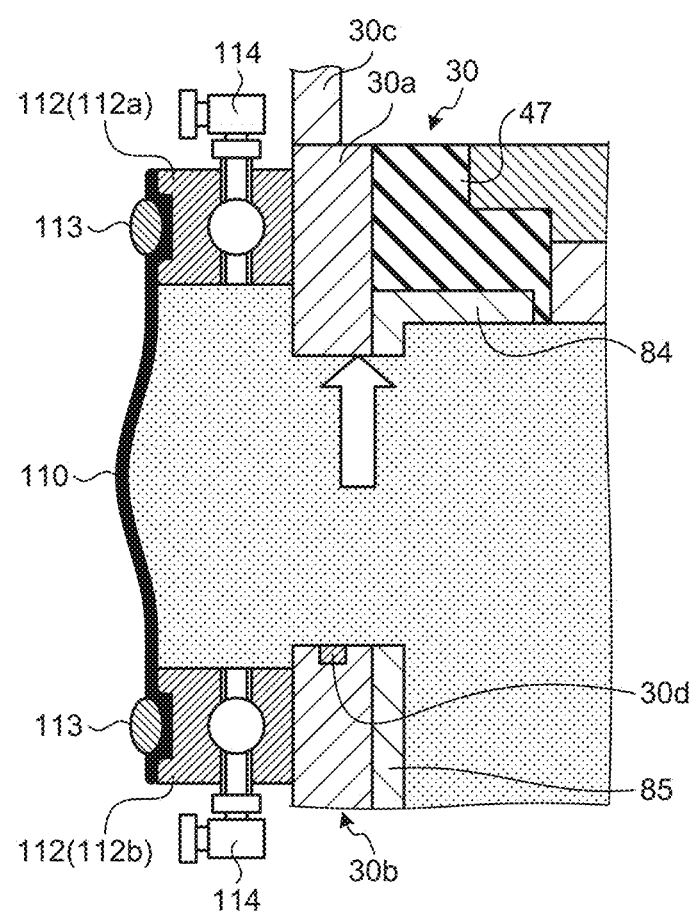
FIG. 7C is a diagram illustrating an example of a state in which an upper part and a lower part are separated.

The operator raises the lifting mechanism 95 to separate the upper part 30a and the lower part 30b. FIG. 7C is a diagram illustrating an example of a state in which the upper part and the lower part are separated. Here, since the inside covered with the cover 110 on the outer peripheral surface of the processing container 30 is shielded from the outside and is filled with dry air, the outside atmospheric air containing moisture is suppressed from reaching the inside of the processing container 30.

Return to FIG. 3. The second maintenance device 102 and the third maintenance device 103 are disposed inside the cover 110.

Figure 8:
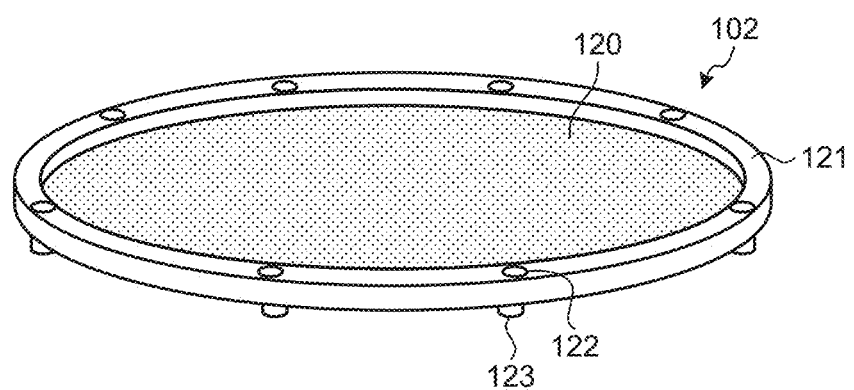
FIG. 8 is a diagram illustrating an example of a configuration of a second maintenance device according to the embodiment.

FIG. 8 is a diagram illustrating an example of a configuration of the second maintenance device according to the embodiment. The second maintenance device 102 has a cover 120. The cover 120 is formed to have a size corresponding to the opening surface of the upper part 30a. The cover 120 has airtightness, and visual transparency at least in a part. For example, the cover 120 is made of a transparent synthetic resin such as polyvinyl chloride, and the entire cover 120 has visual transparency.

The second maintenance device 102 has a fixing member for fixing the cover 120 to the upper part 30a. In the present embodiment, the second maintenance device 102 has a ring member 121 as the fixing member. The ring member 121 is formed in a ring shape having a size corresponding to the opening surface of the upper part 30a, and is provided with a plurality of penetrating threaded holes 122 along the circumferential direction, and an attachment screw 123 is provided to each threaded hole 122.

Figure 9:
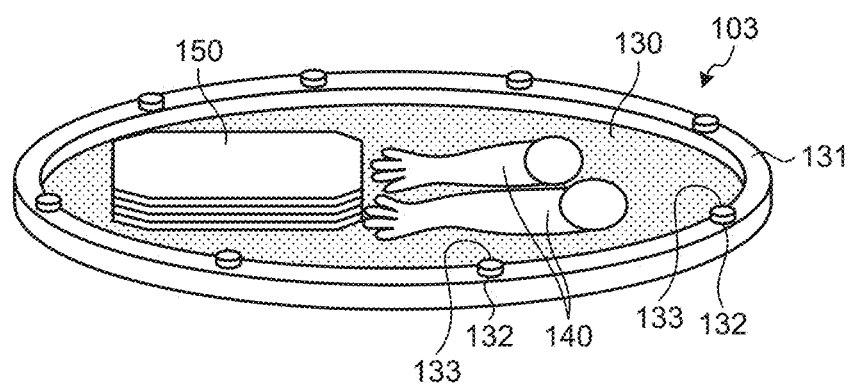
FIG. 9 is a diagram illustrating an example of a configuration of a third maintenance device according to the embodiment.

FIG. 9 is a diagram illustrating an example of a configuration of the third maintenance device according to the embodiment. The third maintenance device 103 has a cover 130. The cover 130 is formed to have a size corresponding to the opening surface of the lower part 30b. The cover 130 has airtightness, and visual transparency at least in a part. For example, the cover 130 is made of a transparent synthetic resin such as polyvinyl chloride, and the entire cover 130 has visual transparency. The cover 130 is provided with bag-shaped gloves 140 having a shape of a hand, and an airtight container 150. The details of the container 150 will be described later.

The third maintenance device 103 has a fixing member for fixing the cover 130 to the lower part 30b. In the embodiment, the third maintenance device 103 has a ring member 131 as the fixing member. The ring member 131 is formed in a ring shape having a size corresponding to the opening surface of the lower part 30b, and is provided with a plurality of penetrating threaded holes 132 along the circumferential direction, and an attachment screw 133 is provided to each threaded hole 132.

Figure 10A:
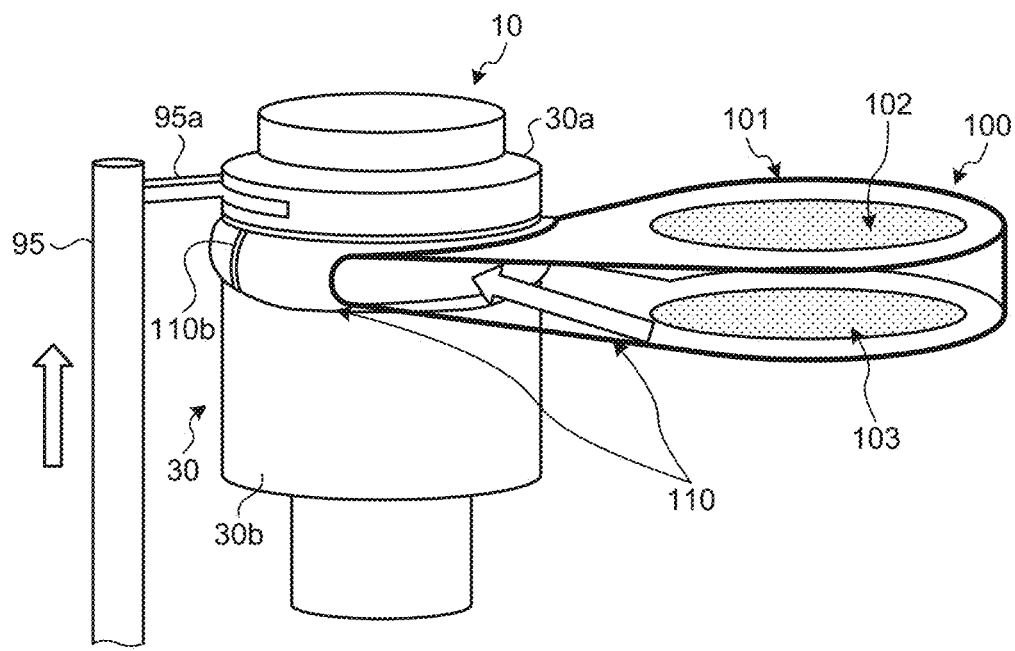
FIG. 10A is a diagram describing an example of a flow of installing the second maintenance device and the third maintenance device according to the embodiment.
Figure 10B:
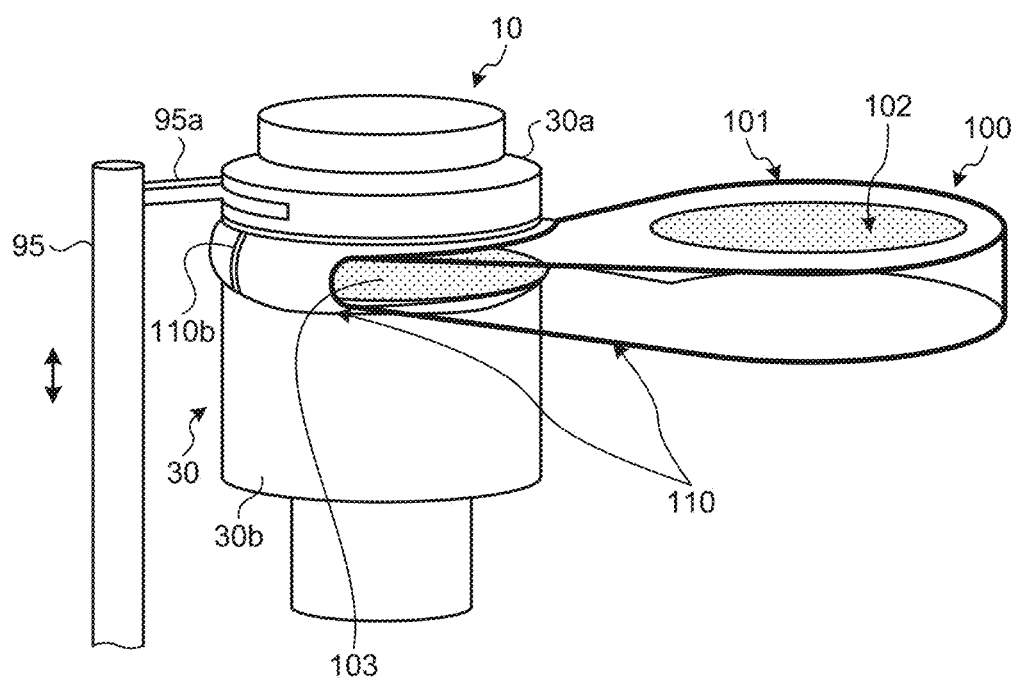
FIG. 10B is a diagram describing an example of the flow of installing the second maintenance device and the third maintenance device according to the embodiment.
Figure 10C:
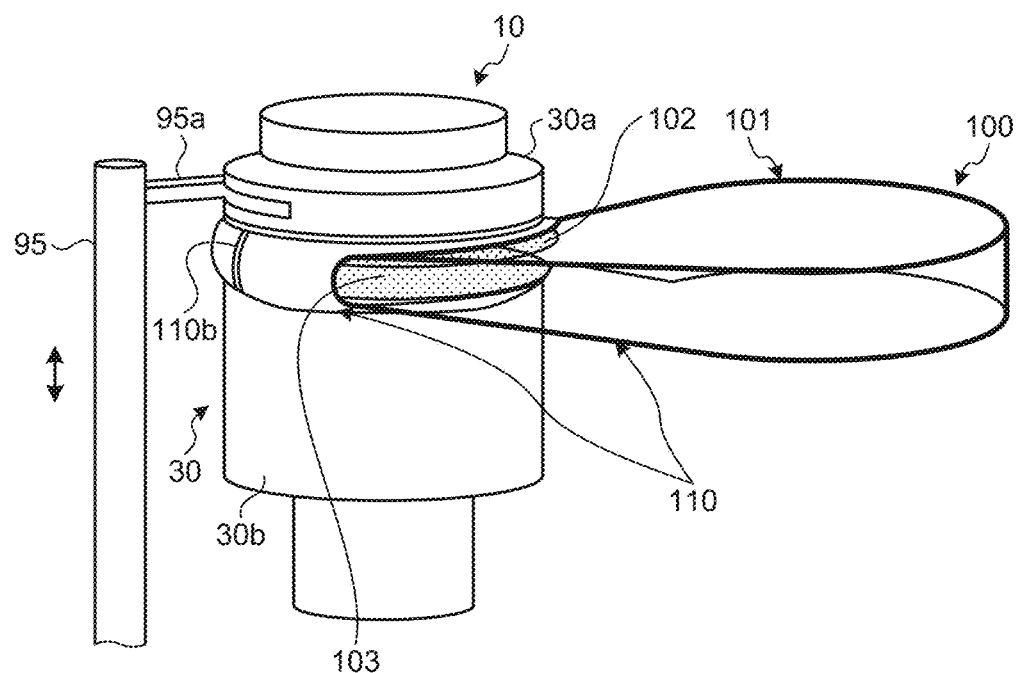
FIG. 10C is a diagram describing an example of the flow of installing the second maintenance device and the third maintenance device according to the embodiment.

FIGS. 10A to 10C are diagrams describing an example of the flow of installing the second maintenance device and the third maintenance device according to the embodiment. As illustrated in FIGS. 10A and 10B, the operator holds the third maintenance device 103 via the cover 110, and moves the third maintenance device 103 into the processing container 30 through the gap between the upper part 30a and the lower part 30b. Then, the operator fixes the ring member 131 on the upper surface of the lower part 30b.

Further, as illustrated in FIG. 10C, the operator holds the second maintenance device 102 via the cover 110, and moves the second maintenance device 102 into the processing container 30 through the gap between the upper part 30a and the lower part 30*b*. Then, the operator fixes the ring member 121 on the lower surface of the upper part 30*a*.

Figure 11A:
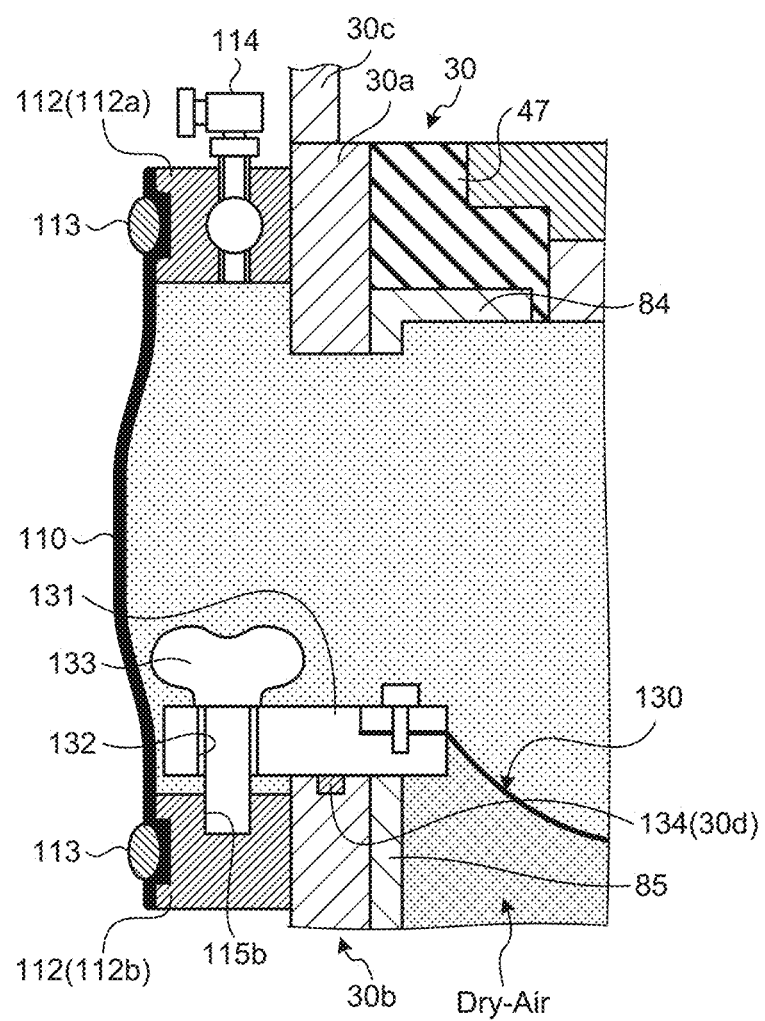
FIG. 11A is a diagram illustrating an example of a state where the third maintenance device according to the embodiment is attached to the lower part.

FIG. 11A is a diagram illustrating an example of a state where the third maintenance device 103 according to the embodiment is attached to the lower part 30*b*. In the embodiment, a threaded hole 115*b* is formed in the adapter 112*b*. The attachment screw 133 of the ring member 131 is attached in the threaded hole 115*b*. The upper surface of the lower part 30*b* is covered with the cover 130. The periphery of the lower part 30*b* is sealed by the attached ring member 131 and a seal member 134 such as an O-ring. As a result, the inside of the lower part 30*b* covered by the third maintenance device 103 is shielded from the outside. The seal member 134 may be used together with the seal member 30*d* used for the joining surface between the upper part 30*a* and the lower part 30*b*.

FIG. 11B is a diagram illustrating an example of a state where the second maintenance device 102 according to the embodiment is attached to the upper part 30*a*. In the embodiment, a threaded hole 115*a* is formed in the adapter 112*a*. The attachment screw 123 of the ring member 121 is attached in the threaded hole 115*a*. The lower surface of the upper part 30*a* is covered with the cover 120. The periphery of the upper part 30*a* is sealed by the attached ring member 121 and a seal member 124 such as an O-ring. As a result, the inside of the upper part 30*a* covered by the second maintenance device 102 is shielded from the outside.

The operator removes the first maintenance device 101. For example, the operator removes the clamp ring 113 and releases the joining of the zipper portion 110*b* of the cover 110 to remove the cover 110 from the periphery of the processing container 30.

Figure 12:
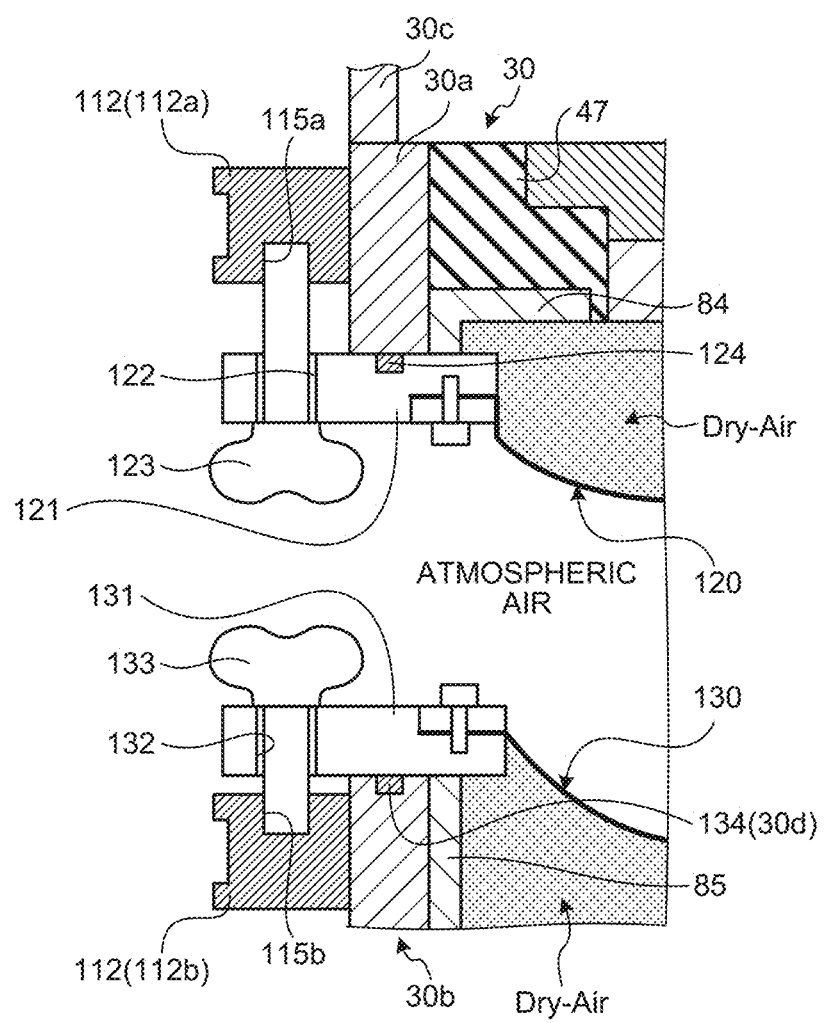
FIG. 12 is a diagram illustrating an example of a state where a first maintenance device according to the embodiment is removed.

FIG. 12 is a diagram illustrating an example of a state where the first maintenance device according to the embodiment is removed. As a result, dry air is maintained in the inside of the upper part 30*a* covered with the second maintenance device 102 and the inside of the lower part 30*b* covered with the third maintenance device 103. Further, the space between the second maintenance device 102 and the third maintenance device 103 becomes an atmospheric space.

Figure 13:
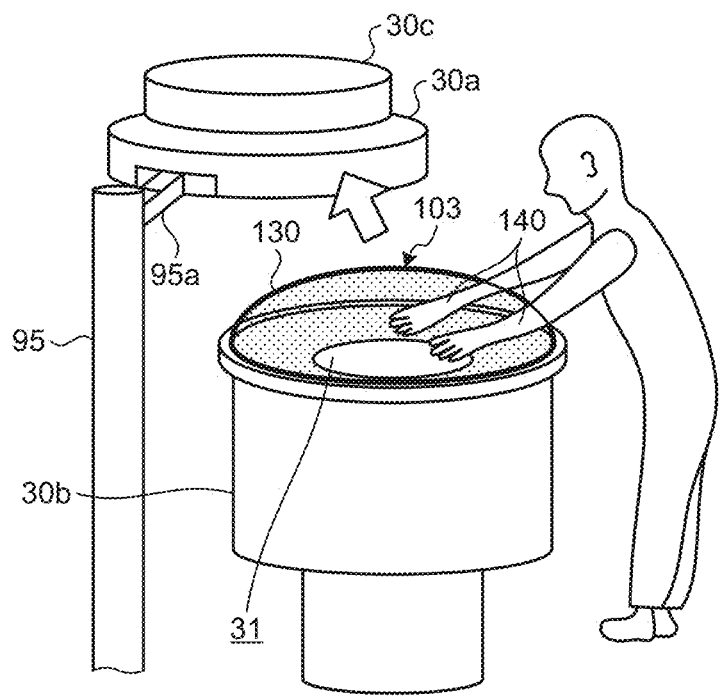
FIG. 13 is a diagram illustrating an example of a state where the upper part according to the embodiment is slid in a rotation direction.

The operator slides the raised upper part 30*a* in the rotation direction by the lifting mechanism 95. FIG. 13 is a diagram illustrating an example of a state where the upper part according to the embodiment is slid in the rotation direction. As a result, a large space can be secured above the lower part 30*b*. The operator can visually check the lower part 30*b* from above via the cover 130 of the third maintenance device 103. Further, as illustrated in FIG. 13, the operator can perform the maintenance of the inside of the lower part 30*b* via the gloves 140 by putting his/her hands into the gloves 140.

Figure 14:
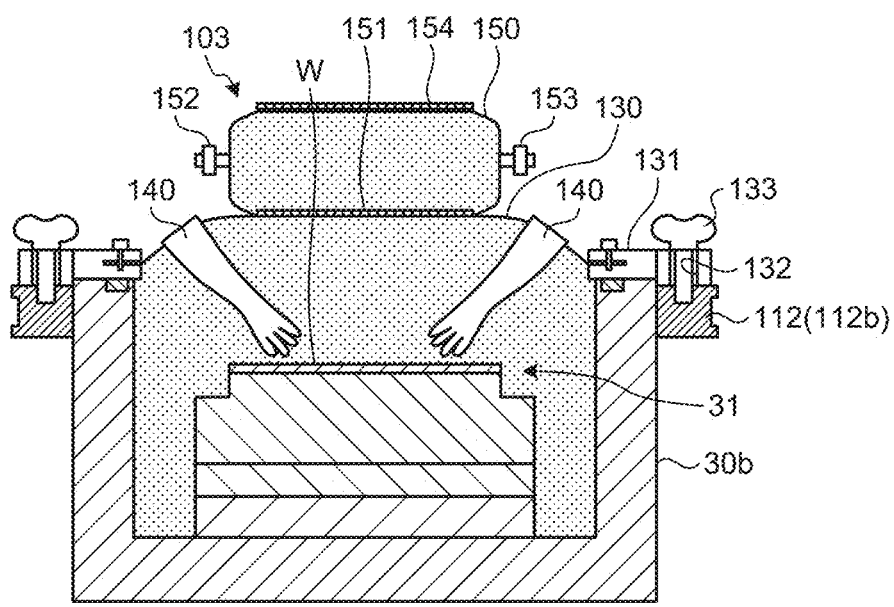
FIG. 14 is a diagram illustrating an example of a state where the inside of the lower part to which the third maintenance device according to the embodiment is attached is filled with dry air.

When performing the maintenance, the operator fills the inside of the lower part 30*b* covered with the cover 130 with dry air. FIG. 14 is a diagram illustrating an example of a state where the inside of the lower part to which the third maintenance device according to the embodiment is attached is filled with dry air. For example, the operator operates the plasma etching apparatus 10 to supply dry air from the lower part 30*b* side to fill the inside of the lower part 30*b* with dry air. In addition, in FIG. 14 and FIGS. 15A and 15B described later, the lower part 30*b* is illustrated in a simplified manner.

As described above, the cover 130 is provided with the airtight container 150. The container 150 is attached on the cover 130 via an airtight fastener 151, and the inside of the container 150 can be made airtight separately from the inside of the cover 130 by closing the airtight fastener 151. The container 150 is provided with two joints 152 and 153 and an airtight fastener 154. The container 150 functions as a load lock chamber that removes the outside atmospheric air containing moisture when relaying various components such as parts, between the inside of the lower part 30*b* covered with the cover 130 and the outside atmospheric space. Instead of the joints 152 and 153, a valve capable of changing the open state and the closed state may be provided to the container 150.

Figure 15A:
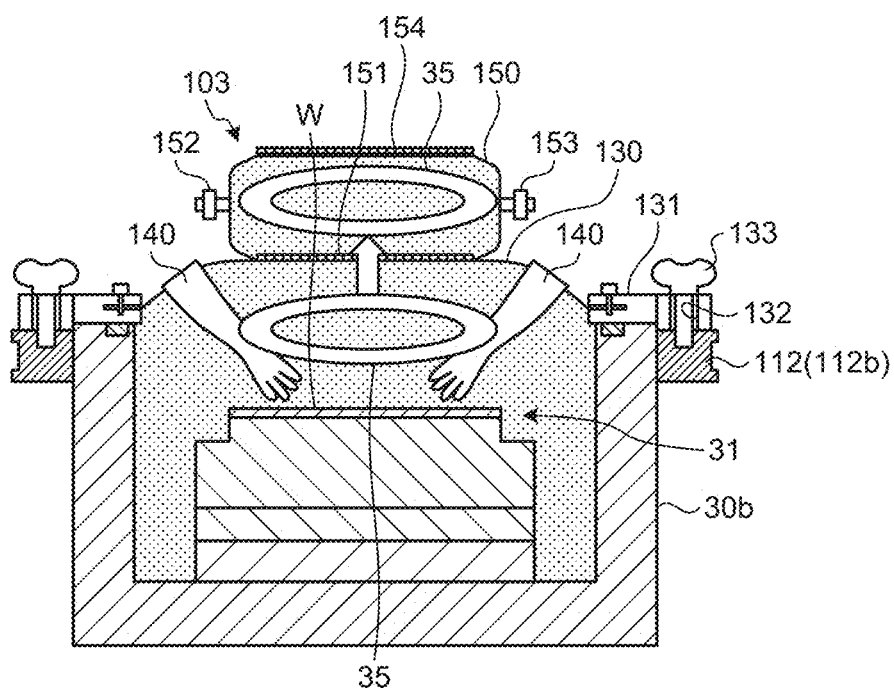
FIG. 15A is a diagram describing an example of a flow of taking out a part by using the third maintenance device according to the embodiment.
Figure 15B:
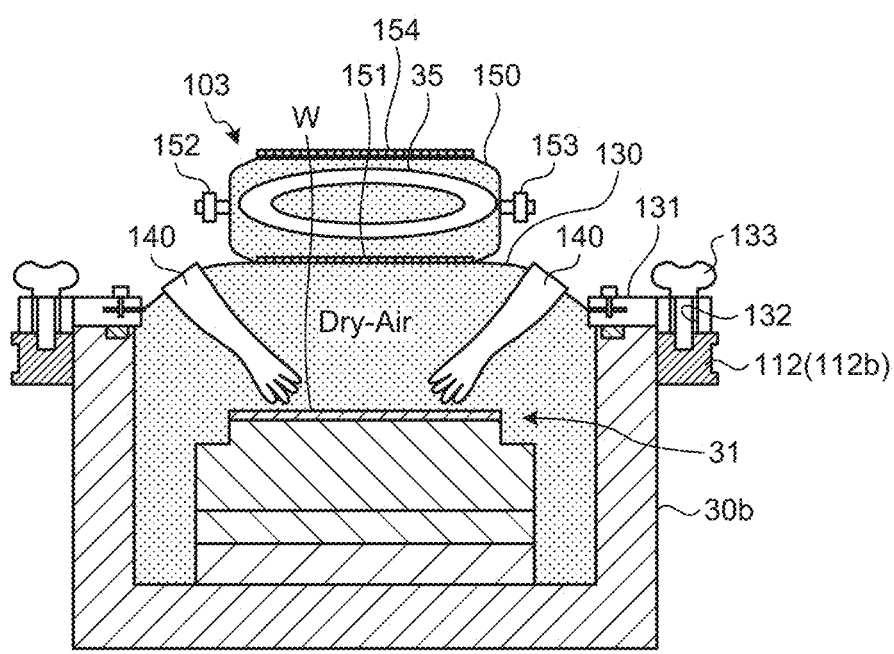
FIG. 15B is a diagram describing an example of the flow of taking out a part by using the third maintenance device according to the embodiment.
Figure 15C:
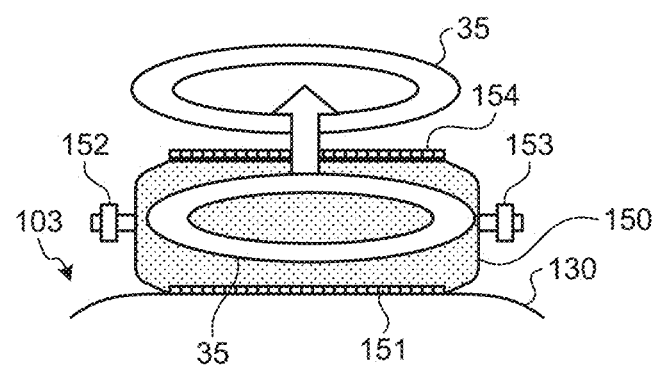
FIG. 15C is a diagram describing an example of the flow of taking out a part by using the third maintenance device according to the embodiment.

Next, an example of the maintenance using the third maintenance device 103 will be described. FIGS. 15A to 15C are diagrams describing an example of the flow of taking out a part by using the third maintenance device according to the embodiment.

The operator replaces various parts inside the lower part via the container 150. For example, in a case of taking out the focus ring 35 inside the lower part 30*b*, the operator fills the inside of the container 150 with dry air. For example, the operator closes the airtight fastener 154, introduces dry air into the container 150 from one of the joints 152 and 153, and opens the other of the joints 152 and 153. As a result, the atmospheric air inside the container 150 is replaced with dry air. Then, the operator puts his/her hands into the gloves 140, opens the airtight fastener 151 via the gloves 140, moves the focus ring 35 to be replaced into the container 150, and closes the airtight fastener 151.

Then, the operator opens the airtight fastener 154, and takes out the focus ring 35 to be replaced from the container 150.

Figure 16A:
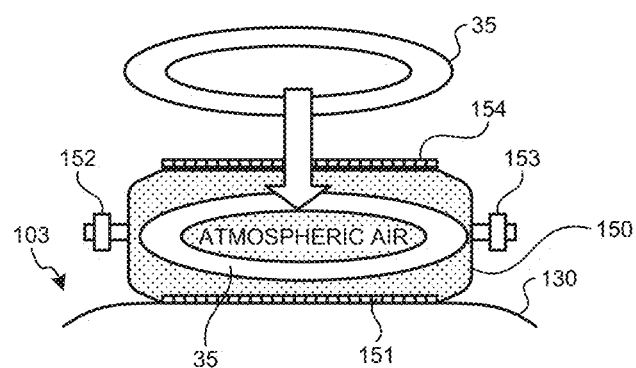
FIG. 16A is a diagram describing an example of a flow of attaching a part by using the third maintenance device according to the embodiment.
Figure 16B:
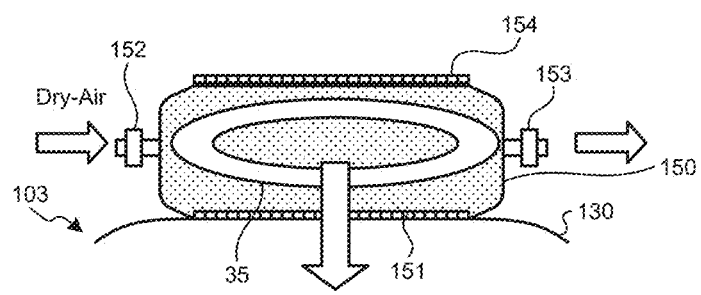
FIG. 16B is a diagram describing an example of the flow of attaching a part by using the third maintenance device according to the embodiment.

FIGS. 16A and 16B are diagrams describing an example of the flow of attaching a part by using the third maintenance device according to the embodiment. For example, in a case of attaching a new focus ring 35, the operator opens the airtight fastener 154, puts the new focus ring 35 into the container 150, and closes the airtight fastener 154. By opening the airtight fastener 154, the inside of the container 150 becomes the atmospheric space.

The operator fills the inside of the container 150 with dry air. For example, the operator introduces dry air into the container 150 from one of the joints 152 and 153, and opens the other of the joints 152 and 153. As a result, the atmospheric air inside the container 150 is replaced with dry air.

The operator puts his/her hands into the gloves 140, opens the airtight fastener 151 via the gloves 140, takes out the new focus ring 35 from the inside of the container 150, and closes the airtight fastener 151. Then, the operator attaches the taken out new focus ring 35 to the inside of the lower part 30*b*.

The deposition or the like may be attached to the part in the processing container 30, such as the used focus ring 35, and the inside of the container 150 may be contaminated with the deposition when the part is moved in the container 150. Therefore, it is preferable that the container 150 is attachable and detachable to and from the cover 130. For example, replacement of a part may be performed in a manner that the container 150 housing the part in the processing container 30 is removed from the cover 130 and the container 150 housing a new part is attached on the cover 130. Further, a plurality of containers 150 may be provided on the cover 130. For example, a container 150 for housing the used part and a container 150 for housing a new part may be provided. In addition, the container 150 may house an instrument used for maintenance or cleaning.

After the maintenance is completed, the operator joins the upper part 30*a* and the lower part 30*b* in a reverse order of opening the processing container 30.

Specifically, the operator returns the slid upper part 30*a* to the position facing the lower part 30*b* by the lifting mechanism 95. Then, the operator mounts the first maintenance device 101. For example, the operator covers the lower portion of the upper part 30*a* and the upper portion of the lower part 30*b* from one side with the opening of the cover 110, and joins the zipper portion 110*b* on the other side. Then, the operator installs the clamp ring 113 along the adapter 112 from above the cover 110.

The operator fills the inside covered with the cover 110 with dry air. The operator connects the gas pipe 105 for supplying dry air, to any joint 114 of the adapter 112 and opens the other joint 114. As a result, the atmospheric air in the inside covered with cover 110, on the outer peripheral surface of the processing container 30 is replaced with dry air.

The operator removes the second maintenance device 102 and the third maintenance device 103. The inside covered with the cover 110 is filled with dry air. Therefore, even if the second maintenance device 102 and the third maintenance device 103 are removed, it is possible to suppress that the inside of the upper part 30*a* and the lower part 30*b* is exposed to the outside atmospheric air containing moisture.

The operator lowers the lifting mechanism 95 to join the upper part 30*a* and the lower part 30*b*. Then, the operator removes the first maintenance device 101. For example, the operator removes the clamp ring 113 and releases the joining of the zipper portion 110*b* of the cover 110 to remove the cover 110 from the periphery of the processing container 30.

In this way, the maintenance device 100 can perform maintenance such as replacement of a part without exposing the inside of the processing container 30 to the outside atmospheric air containing moisture. As a result, after maintenance, the plasma etching apparatus 10 can simplify the process of the moisture control inside the processing container 30 and the like, and can restart the production at an early stage. Further, in the plasma etching apparatus 10, since it is suppressed that the inside of the processing container 30 is exposed to the outside atmospheric air containing moisture, deterioration of the components inside the processing container 30 can be suppressed.

Further, since the maintenance device 100 has few configurations depending on the plasma etching apparatus 10 and has high versatility, the maintenance device 100 can be used for maintenance of various types of plasma etching apparatuses. For example, the maintenance device 100 can be used for maintenance of various types of plasma etching apparatuses shipped in the past.

As described above, the maintenance device according to the embodiment has the cover and the fixing member. The cover is in a vacuum atmosphere during the substrate processing, is formed to have a size corresponding to the boundary line between the first part and the second part of the processing container, which can be separated into the first part and the second part, or the opening surface separating the first part and the second part, and has airtightness, and visual transparency at least in a part. The fixing member fixes in an airtight manner the cover along the boundary line between the first part and the second part of the processing container or to the opening surface separating the first part and the second part. For example, the first maintenance device 101 has the cover 110 and the clamp ring 113. The cover 110 is formed with an opening having a size corresponding to the boundary line between the upper part 30*a* and the lower part 30*b*, and has airtightness, and visual transparency at least in a part. The clamp ring 113 fixes in an airtight manner the cover 110 along the boundary line between the upper part 30*a* and the lower part 30*b*. The second maintenance device 102 also has the cover 120 and the ring member 121. The cover 120 is formed to have a size corresponding to the opening surface of the upper part 30*a*, and has airtightness, and visual transparency at least in a part. The ring member 121 fixes in an airtight manner the cover 120 to the opening surface of the upper part 30*a*. Further, the third maintenance device 103 also has the cover 130 and the ring member 131. The cover 130 is formed to have a size corresponding to the opening surface of the lower part 30*b*, and has airtightness, and visual transparency at least in a part. The ring member 131 fixes in an airtight manner the cover 130 to the opening surface of the lower part 30*b*. Accordingly, the first maintenance device 101, the second maintenance device 102, and the third maintenance device 103 can easily perform maintenance without exposing the inside of the processing container 30 to the outside air.

Further, the cover 110 of the first maintenance device 101 according to the embodiment is a bag body in which an opening having a size corresponding to the boundary line between the upper part 30*a* and the lower part 30*b* is formed, and is provided with the zipper portion 110*b* which can be joined facing each other while maintaining airtightness, at a part of the opening. The cover 110 covers the boundary line between the upper part 30*a* and the lower part 30*b* with the opening to join the zipper portion 110*b*. The clamp rings 113 fix in an airtight manner the cover 110 at positions above and below the boundary line between the upper part 30*a* and the lower part 30*b*. As a result, the first maintenance device 101 can shield the inside covered with the cover 110, on the processing container 30, from the outside.

Further, the cover 120 of the second maintenance device 102 according to the embodiment is formed to have a size corresponding to the opening surface of the upper part 30*a*. The ring member 121 fixes in an airtight manner the cover 120 to the edge of the opening surface of the upper part 30*a*. Further, the cover 130 of the third maintenance device 103 according to the embodiment is formed to have a size corresponding to the opening surface of the lower part 30*b*. The ring member 131 fixes in an airtight manner the cover 130 to the edge of the opening surface of the lower part 30*b*. As a result, the second maintenance device 102 can seal the opening of the upper part 30*a*, and can suppress that the inside of the upper part 30*a* is exposed to the outside atmospheric air containing moisture. Further, the third maintenance device 103 can seal the opening of the lower part 30*b*, and can suppress that the inside of the lower part 30*b* is exposed to the outside atmospheric air containing moisture.

Further, the cover 130 of the third maintenance device 103 according to the embodiment is provided with the gloves 140. As a result, in the third maintenance device 103, the operator can manually perform maintenance of the inside of the lower part 30*b* by putting his/her hands in the gloves 140.

Further, the cover 130 of the third maintenance device 103 according to the embodiment is provided with the airtight fastener 151 that is airtight, and communicates with the airtight container 150 via the airtight fastener 151. Accordingly, the third maintenance device 103 can dispose various components such as parts in the container 150.

Further, the container 150 of the third maintenance device 103 according to the embodiment is provided with the joints 152 and 153 that connect the outside and the inside of the container 150, and the airtight fastener 154 that is airtight. As a result, the third maintenance device 103 can remove the outside atmospheric air containing moisture when relaying various components such as parts, between the third maintenance device 103 and the outside atmospheric space.

Further, the clamp ring 113 of the first maintenance device 101 according to the embodiment is provided with the joint 114 that connects the inside covered with the cover 110 and the outside. Accordingly, the first maintenance device 101 can replace the atmospheric air in the inside covered with the cover 110.

Although the embodiment has been described above, it should be considered that the embodiment disclosed this time is an exemplification in all points and not restrictive. Indeed, the above-described embodiment may be implemented in various forms. Further, the above-described embodiment may be omitted, replaced, or modified in various forms without departing from the scope and spirit of the claims.

Figure 17:
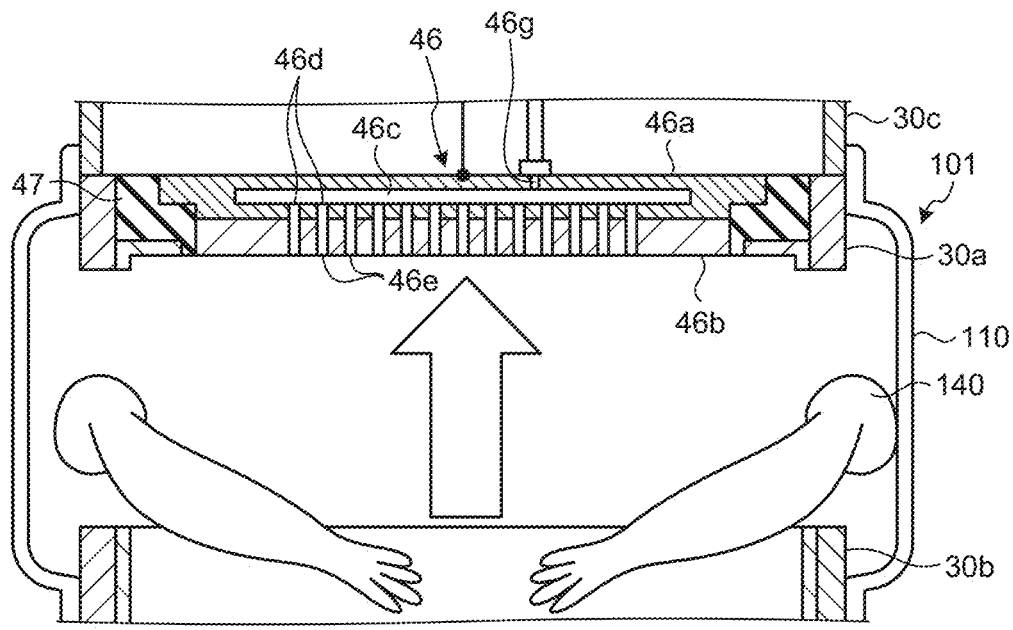
FIG. 17 is a diagram illustrating another example of the first maintenance device according to the embodiment.

For example, in the embodiment, the case where replacement of a part is performed as the maintenance has been described as an example, but the maintenance is not limited to this. Examples of maintenance include visual confirmation of the inside of the processing container 30 and cleaning of the inside of the processing container 30. In a case of visually confirming the internal state of the processing container 30, the first maintenance device 101 may be used alone. Further, one or both of the gloves 140 and the container 150 may be provided to the first maintenance device 101, and replacement of a part may be performed only by the first maintenance device 101. Further, the first maintenance device 101 may be provided with the gloves 140, and the maintenance such as cleaning may be performed. FIG. 17 is a diagram illustrating another example of the first maintenance device according to the embodiment. FIG. 17 illustrates a state in which the gloves 140 are provided to the cover 110 of the first maintenance device 101 and the maintenance of the inside of the upper part 30a and the lower part 30b is performed.

Further, in the embodiment, the case where replacement of a part of the lower part 30b is performed has been described as an example, but in a case where replacement of a part of the upper part 30a is performed, the gloves 140 and the container 150 may be provided to the second maintenance device 102.

Figure 18:
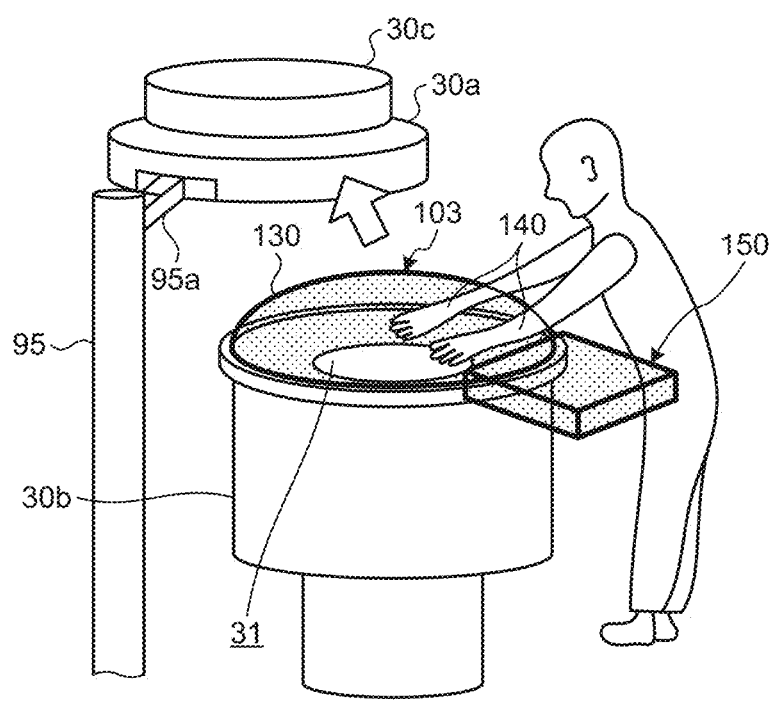
FIG. 18 is a diagram illustrating another example of the third maintenance device according to the embodiment.

In the embodiment, the case where the container 150 of the third maintenance device 103 is provided with the airtight fastener 154 for taking a part in and out from the outside has been described as an example, but the invention is not limited to this. The third maintenance device 103 may be provided with a plurality of containers 150, such as a container 150 in which a new part for replacement are put in advance and a container 150 for storing the used part. Further, the container 150 may be provided on the side surface side of the cover 130. FIG. 18 is a diagram illustrating another example of the third maintenance device according to the embodiment. FIG. 18 illustrates a state in which the container 150 is provided on the side surface side of the cover 130 of the third maintenance device 103.

In addition, in the embodiment, the case where each of the cover 110 of the first maintenance device 101, the cover 120 of the second maintenance device 102, and the cover 130 of the third maintenance device 103 has visual transparency has been described as an example, but the invention is not limited to this. The cover 110, the cover 120, and the cover 130 may have visual transparency only in a part where visual transparency is required for maintenance.

Further, in the embodiment, the case where the glove 140 has a shape of a hand has been described as an example, but the invention is not limited to this. The glove 140 may have any configuration as long as the glove can hold a part and the like.

Further, in the embodiment, the case where the maintenance device 100 is used for maintenance of the plasma etching apparatus 10 has been described as an example, but the invention is not limited to this. The maintenance target device as the target for the maintenance may be any device as long as the device has a processing container which is affected by being exposed to the outside atmospheric air.

According to the present disclosure, it is possible to easily perform maintenance without exposing the inside of the processing container to the outside air.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A maintenance device comprising:
a first cover that is in a vacuum atmosphere during substrate processing, is formed to have a size corresponding to a boundary line between a first part and a second part of a processing container, which is separable into the first part and the second part, and has airtightness, and visual transparency at least in a part; and
first fixing members that fix in an airtight manner the first cover along the boundary line between the first part and the second part of the processing container, wherein
the first cover is a bag body in which an opening having a size corresponding to the boundary line between the first part and the second part is formed, is provided with a zipper portion which enables to maintain airtightness by closing, at a part of the opening, and the first cover covers the boundary line between the first part and the second part to close the zipper portion,
the first fixing members fix in an airtight manner the first cover at positions above and below the boundary line between the first part and the second part.

2. The maintenance device according to claim 1, further comprising a maintenance tool and a second fixing member wherein the maintenance tool is provided with a second cover, the second cover is formed to have a size corresponding to opening surfaces of the first part and the second part, the second fixing member fixes in an airtight manner the second cover to an edge of an opening surface of the first part or the second part.

3. The maintenance device according to claim 2, wherein the second cover is provided with gloves.

4. The maintenance device according to claim 2, wherein the second cover is provided with a first fastener having airtightness, and communicates with an airtight container, via the first fastener.

5. The maintenance device according to claim 4, wherein the container is provided with a valve or joint that connects an inside and an outside of the container, and a second fastener having airtightness.

6. The maintenance device according to claim 4, wherein the container is attachable and detachable to and from the second cover.

7. The maintenance device according to claim 1, wherein the first fixing members are provided with a valve or joint that connects an inside covered with the first cover and an outside.

8. The maintenance device according to claim 1, wherein the first part includes an upper electrode, and the second part includes a lower electrode.

* * * * *